(12) United States Patent
Zhang et al.

(10) Patent No.: US 8,476,085 B1
(45) Date of Patent: Jul. 2, 2013

(54) METHOD OF FABRICATING DUAL TRENCH ISOLATED EPITAXIAL DIODE ARRAY

(75) Inventors: Chao Zhang, Shanghai (CN); Zhitang Song, Shanghai (CN); Xudong Wan, Shanghai (CN); Bo Liu, Shanghai (CN); Guanping Wu, Shanghai (CN); Ting Zhang, Shanghai (CN); Zuoya Yang, Shanghai (CN); Zhifeng Xie, Shanghai (CN)

(73) Assignee: Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 13/203,135

(22) PCT Filed: Jun. 23, 2011

(86) PCT No.: PCT/CN2011/076238
§ 371 (c)(1),
(2), (4) Date: Aug. 24, 2011

(87) PCT Pub. No.: WO2012/037829
PCT Pub. Date: Mar. 29, 2012

(30) Foreign Application Priority Data

Sep. 21, 2010 (CN) .......................... 2010 1 0289920

(51) Int. Cl.
*H01L 21/00* (2006.01)
(52) U.S. Cl.
USPC .................. 438/3; 438/17; 438/42; 438/129; 438/135; 438/141; 257/200; 257/204; 257/209; 257/213; 257/E21.004

(58) Field of Classification Search
None
See application file for complete search history.

(56) References Cited

U.S. PATENT DOCUMENTS
2009/0206315 A1* 8/2009 Weis et al. ...................... 257/4

FOREIGN PATENT DOCUMENTS
CN 200810041516 A1 1/2009

* cited by examiner

*Primary Examiner* — Kyoung Lee
(74) *Attorney, Agent, or Firm* — Ming Chow; Sinorica, LLC (57) ABSTRACT

The present invention discloses a method of fabricating dual trench isolated epitaxial diode array. This method starts with the formation of heavily-doped first conductivity type regions and heavily-doped second conductivity type regions on the substrate, followed by epitaxial growth, then the formation of the isolations between diode array word lines by deep trench etch and the formation of the isolations between bit lines vertical to deep trenches by shallow trench etch, and finally the formation of separate diode array cells in the regions enclosed by deep and shallow trench isolations by ion implantation. This invention also provides a method of preventing the crosstalk current between adjacent word lines and bit lines of epitaxial diode arrays isolated by foregoing dual shallow trenches. This invention can be used for diode-driven, high-density, large-capacity memory, such as phase change random access memory, resistive memory, magnetic memory and ferroelectric memory; the method thereof is completely compatible with conventional complementary metal-oxide semiconductor (CMOS) process, and because the diode arrays can be formed before the formation of peripheral circuits, no drift of peripheral circuits will be caused by the thermal process thereof, thereby solving the technical challenge of fabricating high-density, large-capacity embedded phase change random access memory.

13 Claims, 7 Drawing Sheets

METHOD OF FABRICATING DUAL TRENCH ISOLATED EPITAXIAL DIODE ARRAY

FIELD OF THE INVENTION

The present invention belongs to the semiconductor field, relating to a structure of a driving diode array of nanoscale, high-density, large-capacity memory and a fabrication method thereof, and more particularly to a method of fabricating dual trench isolated epitaxial diode array.

BACKGROUND OF THE INVENTION

Phase change memory (also known as phase change random access memory, PCRAM), emerging along with the development of nano processing technology, is a new generation of non-volatile semiconductor memory, compatible with complementary metal-oxide semiconductor (CMOS) integrated circuit. As the device feature size is scaling down to nanometer range and continuing to decrease, the memory characteristics of PCRAM based on reversible phase change resistor exhibit greater performance (eg. low power consumption and high speed) at several nanometer scale and are better in the overall performance than currently commercialized flash memory technology. Therefore it is universally regarded as a significant breakthrough of memory technology apart from flash in the industry, enjoying a high competitive position and extensive commercial value in future memory market. As a result, major semiconductor memory manufacturers in the world have taken PCRAM as an alternative technology of flash and dynamic random access memory (DRAM) after 45 nm node and as an emphasis in research and development since 2002 as well.

Among various kinds of mature memories, metal-oxide-semiconductor field-effect transistor (MOSFET) is widely used as a selector switch device. A high transient current (of about 0.5-2 mA/cell) is required for PCRAM to execute RESET operation. If MOSFET is chosen as a selector switch, the trench width must be increased to meet the requirements of high current and the cell area is necessary to be increased as well. Some international corporations, including Renesas, adopt a structure of MOSFET+phase change resistor, wherein the cell area is in the range of 25 to 45 $F^2$ (wherein F is the dimension of the minimum half-period of active area at a technology node, and, taking the design rule of 45 nm logic circuit as an example, the minimum dimension of both active area and oxidation isolation region are 70 nm, so F is equal to 70 nm and $F^2$ is equal to 4900 $nm^2$). The larger the cell area, the less competitive the technology. Currently, the cell area of DRAM and flash is substantially in the range of 6 to 12 $F^2$; therefore, if MOSFET is used as the selector switch, it's impossible to take part in the competition of high-density large-capacity memories and can only be applied to certain special fields.

In order to improve the current driving capability of the selector switch device and maintain the memory cell area, bipolar device is the optimum choice; therefore, the development as well as the fabrication of bipolar driving device is the key to the industrialization of high-density large-capacity PCRAM chip.

Samsung has developed patent technologies of diode array fabrication utilizing selective silicon epitaxy as the key technology, wherein the cell area is about 5.8 $F^2$. However, due to the adoption of selective epitaxy, which has a high requirement of process flow and high fabrication cost as a result and by which the diodes are fabricated after the fabrication of CMOS transistors, the thermal process for selective epitaxial single crystal silicon is able to incur performance drift of sensitive 45 nm CMOS transistor devices such that the yield of 45 nm CMOS logic circuits is decreased and the whole set of process is not suitable to be applied to embedded phase change random access memory at 45 nm. Zhang Ting etc. from Shanghai Institute of Mircrosystem and Information Technology under Chinese Academy of Sciences disclosed a structure of dual shallow trench isolated diode array and fabrication process thereof (CN Patent, Manufacturing Method of Bipolar Transistor Array Isolated by Double Shallow Slots, Application No.: 200810041516.5), wherein current semiconductor manufacturing process is adopted to form heavily-doped low resistance word lines by deep trench and sidewall diffusion doping and then to form bipolar transistor by ion implantation and lithography, and wherein two methods as follow are adopted to form heavily-doped low resistance word lines: 1. upon the deep trench etch, undoped or P type doped oxide is deposited on the trench bottom before N type heavily-doped arsenic silicon glass is deposited thereon and etched back to certain depth, and then thermal diffusion process is carried out; 2. when the deep trench is etched to half of the depth, arsenic silicon glass is deposited thereon and etched back to certain depth, and then thermal diffusion process is carried out before the removal of arsenic silicon glass and subsequent deep trench etch to a specified depth.

The challenge of fabricating high-density diode array at nanometer scale is to effectively reduce the crosstalk current between adjacent word lines and bit lines. Due to the decrease of size, the distance between adjacent word lines decreases accordingly and the leakage current through P type substrate between word lines increases; when a large current pulse flows through a selected word line, the non-selected word lines adjacent to it will be disturbed by the switching noise to misoperate, and the nonuniformity of both the deep trench depth and the bottom depth of word line buried layer will increase the possibility of signal interference between adjacent word lines. Meanwhile, due to the decrease of the distance between bit lines and the depth of shallow trenches, large crosstalk current between adjacent bit lines will cause misoperation. Based on this, the present invention provides a method of fabricating dual trench isolated epitaxial diode array, wherein, by optimization of the method, the crosstalk current between adjacent bit lines and word lines can be effectively prevented, and therefore make it suitable to be applied to diode-driven, high-density large-capacity memories, such as phase change random access memory, resistive memory, magnetic memory and ferroelectric memory.

SUMMARY OF THE INVENTION

The main technical problem to be solved in the present invention is to provide a method of fabricating dual trench isolated epitaxial diode array.

In order to solve the foregoing technical problem, the present invention adopts the following technical scheme:

A method of fabricating dual trench isolated epitaxial diode array, comprising the following steps:

(A) form heavily-doped first conductivity type (P+ type) regions on the substrate of the first conductivity type (P type), and then form heavily-doped second conductivity type (N++ type) regions on said heavily-doped first conductivity type (P+ type) regions; the heavily-doped first conductivity type (P+ type) regions aim to reduce the leakage current between word lines and the heavily-doped second conductivity type (N++ type) regions mainly serve as low resistance word line buried layer;

(B) form an epitaxial layer on heavily-doped second conductivity type (N++ type) regions;

(C) form first trenches deep to heavily-doped first conductivity type (P+ type) regions by lithography and etch so as to divide heavily-doped second conductivity type (N++ type) regions into multiple word lines; then form an oxide layer on the inner surface of first trenches by thermal oxidization before polysilicon is filled into the first trenches as insulating isolation layer; remove the polysilicon on the top of the first trenches by etching back before oxide is filled in so as to reduce the probability of word line leakage current caused by subsequent ion implantation; form the first trench isolation structures after planarization process;

(D) form second trenches vertical to the first trench isolation structures over word lines by lithography and etch; then form an oxide layer on the inner surface of second trenches before insulation material is filled into second trenches by chemical vapor deposition, and form the second trench isolation structures after planarization process;

(E) divide the epitaxial layer into multiple isolation regions by the first and second trench isolation structures, wherein isolation regions of both ends of the same word line serve as the pickup regions of the word line and the remaining isolation regions serve as diode array cell regions; form diode P+ type regions and lightly doped N type regions in diode array cell regions by lithography, ion implantation and annealing so as to form diode array cells; isolate word lines from each other by the first trench isolation structures and isolate diode array cells on the same word line by second trench isolation structures;

(F) form word line connect by ion implantation in the pickup regions of word lines so as to reduce series resistance of word lines; fabricate memory cells over diode array cells and pick up bit lines.

Wherein, in step (A), heavily-doped first conductivity type (P+ type) regions and heavily-doped second conductivity type (N++ type) regions are formed by ion implantation or solid diffusion; the dopant atoms of said heavily-doped first conductivity type (P+ type) regions are boron and the dopant atoms of said heavily-doped second conductivity type (N++ type) regions are arsenic, phosphorus or antimony; a epitaxial layer of a thickness in the range of 0.1 microns to 2 microns is formed in step (B) by chemical vapor deposition epitaxy, molecular beam epitaxy, solid phase epitaxy, liquid phase epitaxy or atomic layer deposition; first trenches formed in step (C) have a depth in the range of 0.4 microns to 10 microns (where the depth and spacing of trenches vary with technology node); second trenches formed in step (D) have a depth in the range of 0.1 microns to 2 microns; the dopant atoms implanted by ion implantation are boron and phosphorus respectively for the P+ type regions and lightly doped N type regions formed in step (E). Preferably, said second trenches have a depth greater than or equal to the thickness of the epitaxial layer.

The present invention provides a process method of fabricating dual trench isolated epitaxial diode array, wherein the heavily-doped second conductivity type (N++ type) buried layer is used as low resistance word lines of diode arrays, and the epitaxial layer is used as the formation region of diode cells; the regions isolated by the isolation structures of deep trenches (i.e. first trenches) and shallow trenches (i.e. second trenches) form diode array cells, word lines are isolated from each other by deep trench isolation structures, and diode array cells on the same word line are isolated by shallow trenches; the shallow trenches have a depth greater or at least equal to the thickness of the epitaxial layer, thereby increasing the minority carrier coupling at the bottom of shallow trenches and reducing the leakage current between adjacent bit lines; the leakage current between word lines is isolated by the oxide layer and the undoped polysilicon insulating isolation layer that are filled into the deep trenches, and, at the same time, the leakage current between word lines is reduced by heavily-doped first conductivity type (P+ type) regions at the bottom.

In order to prevent the crosstalk current between bit lines of the dual shallow trench isolated diode array, as a preferable scheme of the present invention, during the formation of the second trench isolation structures in step (D), impurities of the second conductivity type (N type) are implanted into the bottom of second trenches by ion implantation after second trenches are etched and oxidized to form the oxide layer by thermal oxidization. The depth of said second trenches can be less than the thickness of the epitaxial layer. The dopant atoms of said second conductivity type (N type) are phosphorus, arsenic and etc., wherein the implantation depth is the difference between the epitaxial layer thickness and the second trench depth, and the concentration of the implanted impurities is equivalent to the concentration of said heavily-doped second conductivity type (N++ type) regions By the foregoing method of preventing the crosstalk current between bit lines of the dual shallow trench isolated diode array, when the epitaxial layer thickness is greater than the isolation depth of shallow trenches, N type conductivity impurities are implanted into the shallow trench bottom to increase the minority carrier coupling in this region so as to reduce the leakage current between bit lines.

In order to prevent the crosstalk current between word lines of the dual shallow trench isolated diode array, as a preferable scheme of the present invention, during the formation of the first trench isolation structures in step (C), impurities of the first conductivity type are implanted into the bottom of first trenches by ion implantation after first trenches are etched and the oxide layer is formed, and said impurities of the first conductivity type are activated to diffuse at the first trench bottom before polysilicon is filled into first trenches as insulating isolation layer; the polysilicon on the top of the first trenches is removed by etching back before oxide is filled in, and then the first trench isolation structures is formed after planarization process, wherein impurities of said first conductivity type are boron or boron fluoride.

By the foregoing method of preventing the crosstalk current between word lines of the dual shallow trench isolated diode array, atoms of the same type as the substrate are doped into the deep trench bottom by deep implantation after the formation of deep trenches, and the dopant atoms are then diffused into the region below the N++ buried layer by thermal diffusion so as to prevent leakage current between word lines.

The present invention provides a method of fabricating dual trench isolated epitaxial diode array as well as a method of preventing crosstalk current between bit lines and word lines. These methods are completely compatible with conventional CMOS process and because the diode arrays can be formed before the formation of peripheral circuits, no drift of peripheral circuits will be caused by the thermal process thereof; therefore can be applied to various kinds of memory devices, and more particularly to phase change random access memory, solving the technical challenge of fabricating high-density, large-capacity embedded phase change random access memory.

DETAILED DESCRIPTION OF THE EMBODIMENTS

The present invention is further detailed below with reference to the drawings. The present invention provides preferred embodiments, but the embodiments described shall not be interpreted as a limitation. In order to illustrate the structures in a more explicit manner, the thickness of the layer and region is properly magnified in the drawings; however, the schematic drawings shall not be regarded as an exact representation of the geometric proportion. Reference drawings are schematics for the present invention, wherein the illustrations are only on a schematic basis and shall not be construed as a limitation of the scope of the present invention.

Embodiment 1

Figure 1A:
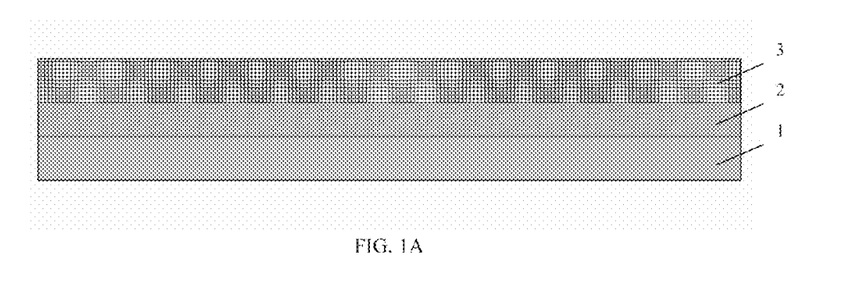
FIG. 1A-1H are process flowcharts of fabricating dual trench isolated epitaxial diode array in embodiment 1.
Figure 1B:
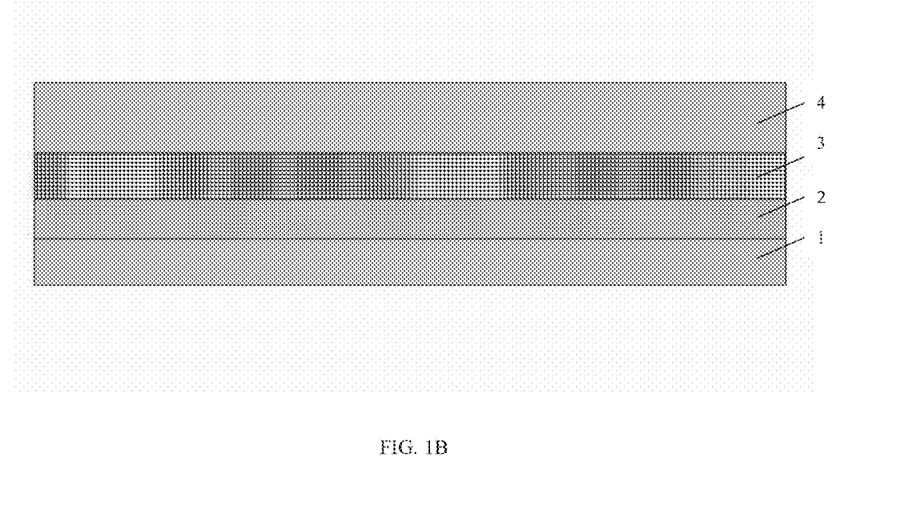
Figure 1C:
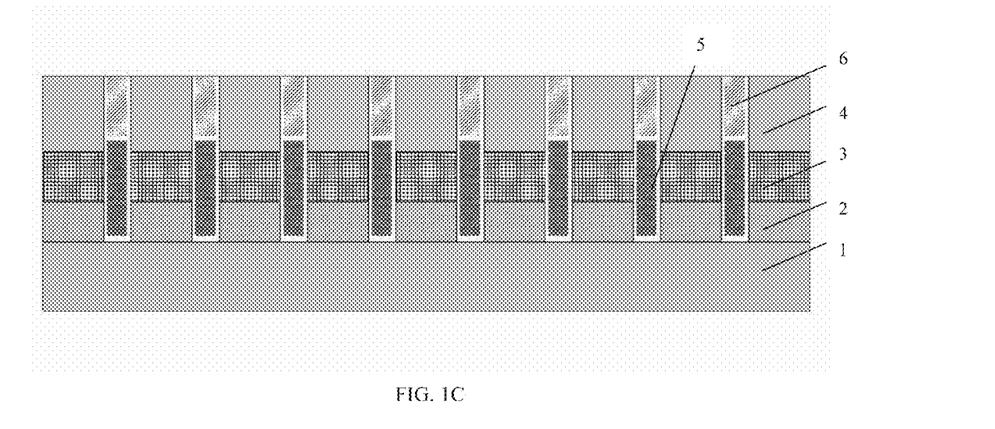

With reference to FIG. 1A-1H, this embodiment provides a method of fabricating dual trench isolated epitaxial diode array used for phase change random access memory; however, the method of fabricating diode array in the present invention is not limited to only the application in phase change random access memory, but can also be applied to other kinds of memory devices, such as resistive memory, magnetic memory and ferroelectric memory, the method comprising the following steps:

(1) form heavily-doped first conductivity type (P+ type) regions 2 and heavily-doped second conductivity type (N++ type) regions 3 by ion implantation in the regions where diode arrays are situated on substrate 1 of the first conductivity type (P type); as shown in FIG. 1A, the heavily-doped first conductivity type (P+ type) regions 2 mainly aim to reduce the leakage current between word lines, and the heavily-doped second conductivity type (N++ type) regions 3 serves as low resistance word line buried layer;

(2) form epitaxial layer 4 of a thickness in the range of 0.1 microns to 2 microns by chemical vapor deposition; as shown in FIG. 1B, a typical thickness of epitaxial layer 4 is 0.4 microns;

(3) form deep trenches of a depth in the range of 0.4 microns to 10 microns by lithography and etch (where the depth and spacing of trenches vary with technology node); then form a thin oxide layer by thermal oxidization and fill polysilicon in trenches as insulating isolation layer 5; remove the polysilicon on the top of deep trenches by etching back polysilicon before oxide 6 is filled in so as to reduce the probability of word line leakage current caused by subsequent ion implantation; as shown in FIG. 1C.

Figure 1D:
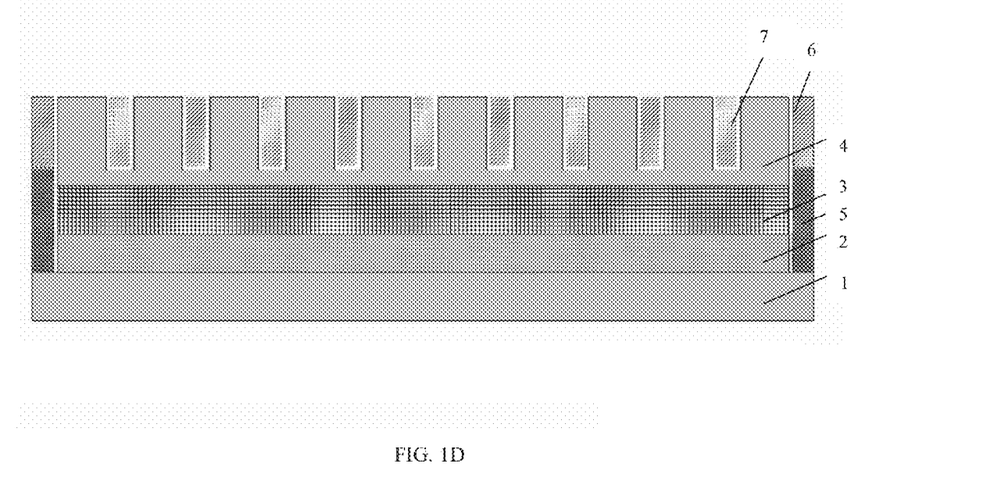

(4) after planarization process, form shallow trenches vertical to deep trench isolation structures over word lines by lithography and etch; then form an oxide layer on the inner surface of shallow trenches by thermal oxidization before insulation material 7 is filled into shallow trenches by chemical vapor deposition, and form shallow trench isolation structures after planarization process. The shallow trenches have a depth in the range of 0.1 microns to 2 microns, and the depth of shallow trenches is greater than or equal to the thickness of epitaxial layer 4; as shown in FIG. 1D.

Figure 1E:
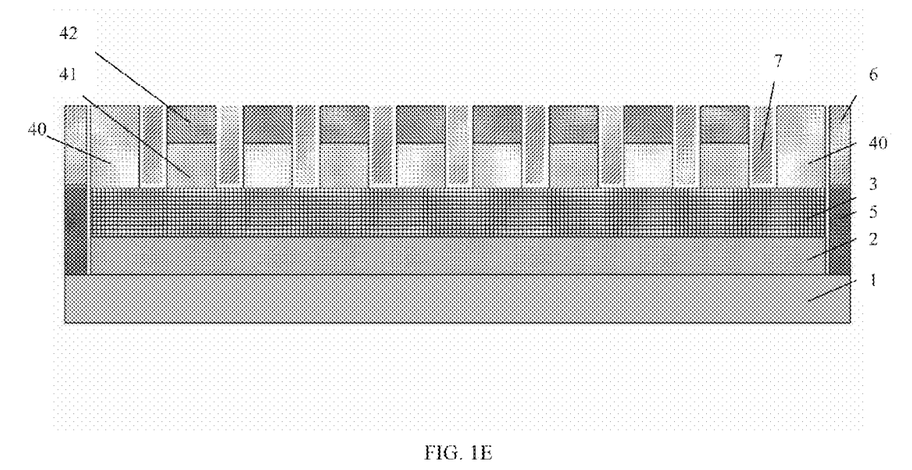

(5) divide epitaxial layer 4 into multiple isolation regions by deep trench isolation structures and shallow trench isolation structures, wherein isolation regions of both ends of the same word line serve as the pickup regions 40 of the word line and the remaining isolation regions serve as diode array cell regions; form diode lightly doped N type regions 41 and P+ type regions 42 in diode array cell regions by lithography, ion implantation and annealing so as to form diode array cells; isolate word lines from each other by deep trench isolation structures, and isolate diode array cells on the same word line by shallow trench isolation structures; as shown in FIG. 1E.

Figure 1F:
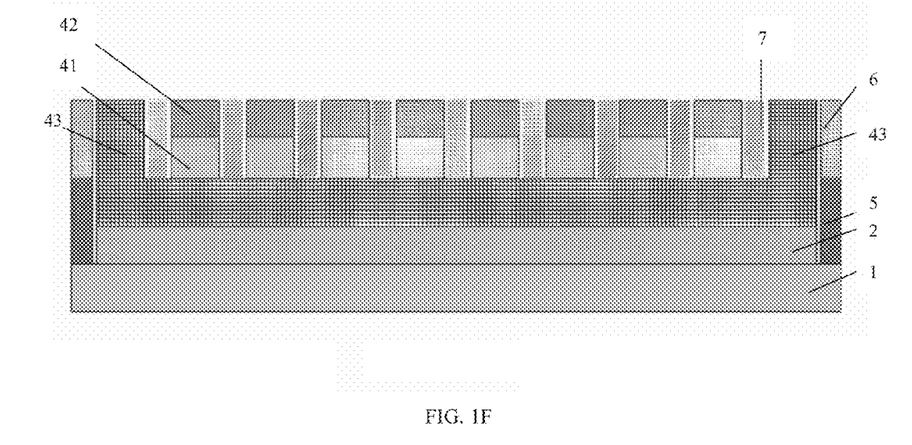

(6) form word line connect 43 by ion implantation in the pickup regions 40 of both ends of word lines so as to reduce series resistance of word lines, as shown in FIG. 1F.

Figure 1G:
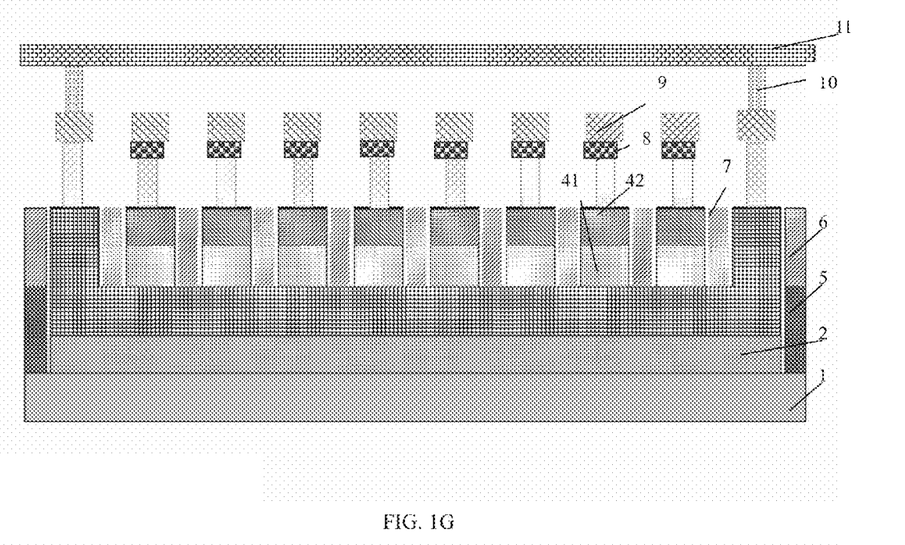
Figure 1H:
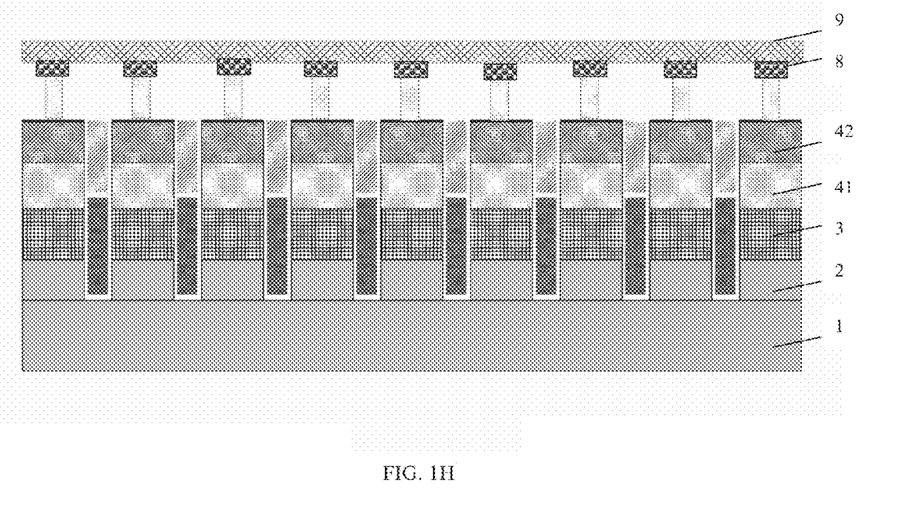

(7) finally, fabricate phase change random access memory cells 8 over diode array cells and pick up bit lines by first metal layer 9, and then pick up the word lines by second metal layer 10 and second metal layer 11. The cross-sectional schematic view along the direction of bit lines in diode arrays is shown in FIG. 1G, and the cross-sectional schematic view along the direction of word lines is shown in FIG. 1H, wherein memory cells of other types and structures can also be fabricated over diode array cells and have the bit lines led out.

Figure 4A:
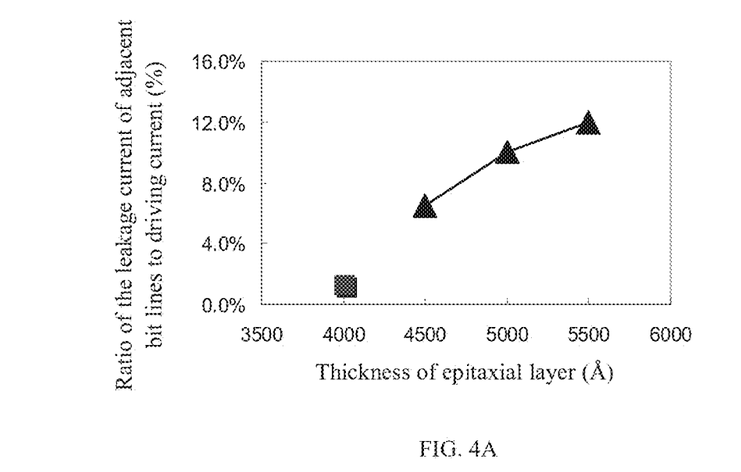
FIG. 4A is the relationship between the ratio of the leakage current of adjacent bit lines to driving current and the epitaxial layer thickness in embodiment 1.
Figure 4B:
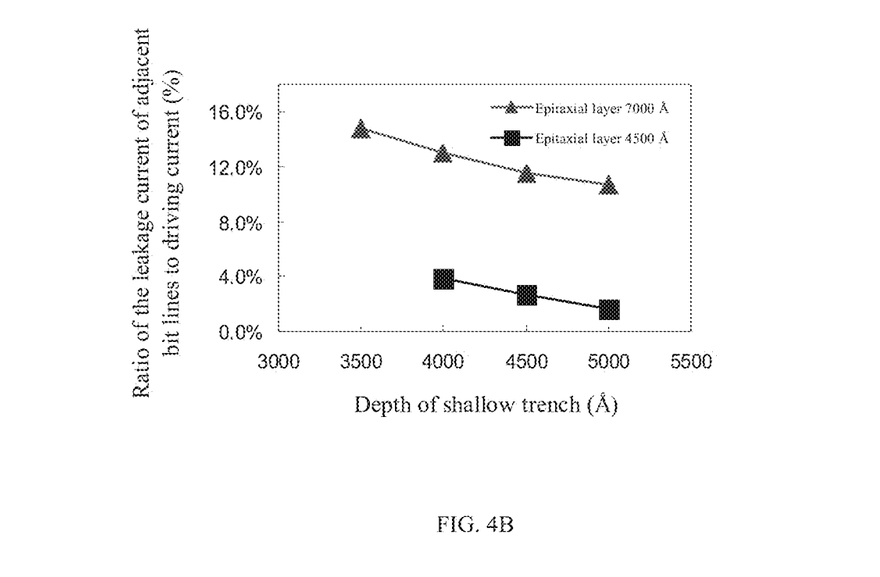
FIG. 4B is the relationship between the ratio of the leakage current of adjacent bit lines to driving current and the shallow trench depth in embodiment 1.
Figure 5A:
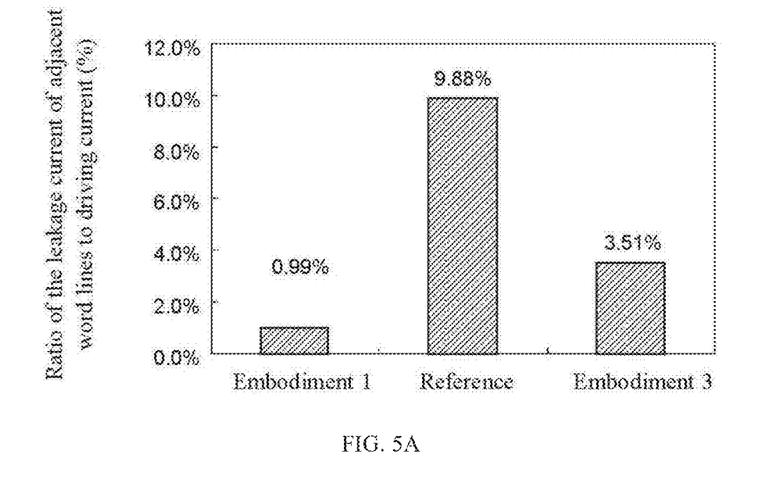
FIG. 5A are the ratios of the leakage current of adjacent word lines to driving current under different conditions in embodiments.

In this embodiment, the leakage current between word lines is reduced by deep trenches and heavily-doped first conductivity type (P+ type) regions, with the leakage current between adjacent word lines reduced from 10% to around 1% by doping of the same type as the substrate, as shown in FIG. 5A; the leakage current between adjacent bit lines is reduced by increasing the depth of shallow trenches and decreasing the thickness of epitaxial layer, wherein the shallow trenches have a depth greater or at least equal to the thickness of the epitaxial layer; the relationship between the leakage current of adjacent bit lines and the epitaxial layer thickness, and the relationship between the leakage current of adjacent bit lines and the shallow trench depth are indicated in FIG. 4A and FIG. 4B respectively, from which it can be found that the leakage current between adjacent bit lines is effectively prevented with the decrease of the thickness of the epitaxial layer and the increase of the depth of shallow trenches, that is to say, the parasitic bipolar effect between adjacent bit lines is prevented; this method is completely compatible with conventional CMOS process, and because the diode arrays can be formed before the formation of peripheral circuits, no drift of peripheral circuits will be caused by the thermal process thereof, thereby solving the technical challenge of fabricating high-density, large-capacity embedded phase change random access memory.

Embodiment 2

By the optimization of the fabrication method, this embodiment provides a method of preventing the crosstalk current between bit lines of the dual shallow trench isolated diode array:

(1) firstly, form heavily-doped first conductivity type (P+ type) regions and heavily-doped second conductivity type (N++ type) regions by ion implantation in the regions where diode arrays are situated on substrate 1 of the first conductivity type (P type), as shown in FIG. 1A; the heavily-doped first conductivity type (P+ type) regions mainly aim to reduce the leakage current between word lines, and the heavily-doped second conductivity type (N++ type) regions serve as low resistance word line buried layer. After annealing under vacuum conditions, the width of word lines is greater than 0.2 microns and typical widths are 0.4 microns, 0.5 microns, 0.6 microns, 0.7 microns and etc.

(2) deposit an intrinsic epitaxial layer on heavily-doped second conductivity type (N++ type) regions by chemical vapor epitaxy, wherein a typical thickness is in the range of 0.2 microns to 0.8 microns, as shown in FIG. 1B. The epitaxial layer in this embodiment is an undoped intrinsic epitaxial layer, wherein three main steps involved in the growth of the epitaxial layer are: 1. pre-baking; 2. the intrinsic epitaxial layer growth under high temperature, low pressure, low gas flow and low deposition rate conditions; 3. the main epitaxial layer growth under low temperature, low pressure, high gas flow and high deposition rate conditions. This method of epitaxial growth can effectively prevent auto-doping effect of the epitaxial layer caused by heavily-doped substrate.

(3) form deep trenches of a depth in the range of 0.4 microns to 10 microns by lithography and etch (where the depth and spacing of trenches vary with technology node); then form a liner oxide layer by thermal oxidation and fill polysilicon in trenches as insulating isolation layer; remove the polysilicon on the top of deep trenches by etching back polysilicon before oxide is filled in so as to reduce the probability of word line leakage current caused by subsequent ion implantation; as shown in FIG. 1C.

(4) after planarization process, form shallow trench isolations vertical to deep trenches by lithography, etch, thermal oxidation, chemical vapor deposition and etc. that are compatible with conventional CMOS process, as shown in FIG. 1D, wherein the shallow trenches have a depth in the range of 0.1 microns to 2 microns, and typical depths are 0.28 microns, 0.4 microns and etc.

Figure 2A:
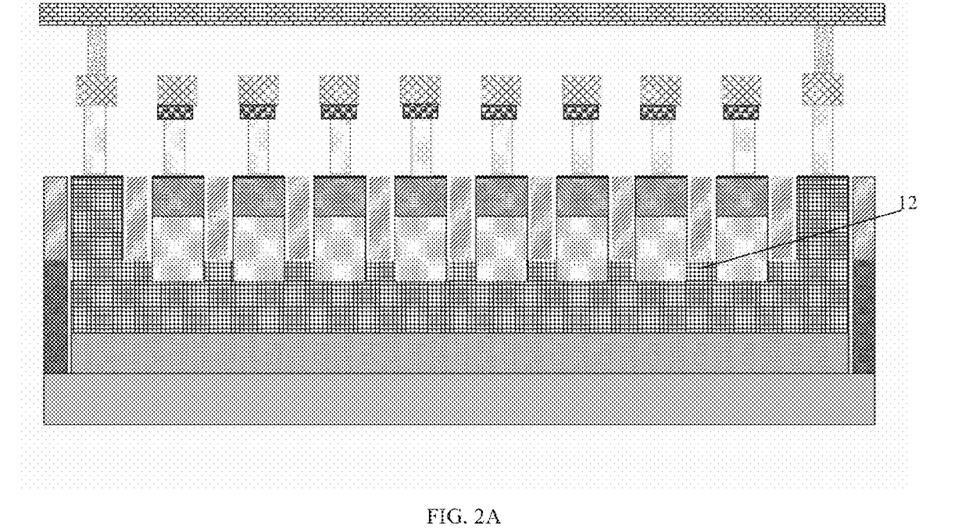
FIG. 2A is a schematic view of the method of preventing crosstalk current between adjacent bit lines of dual shallow trench isolated diode array in embodiment 2.

(5) after the shallow trenches are etched and oxidized to form a liner oxide layer, dopant atoms 12 of the same type as the heavily-doped second conductivity type (N++ type) regions are implanted by ion implantation, as shown in FIG. 2A, to increase the N type impurity concentration at the shallow trench bottom and increase the probability of minority carrier coupling so as to reduce the leakage current between bit lines.

(6) after the shallow trench filling and planarization processes, divide the epitaxial layer into multiple isolation regions by deep trench isolation structures and shallow trench isolation structures, wherein isolation regions of both ends of the same word line serve as the pickup regions of the word line and the remaining isolation regions serve as diode array cell regions; form diode P+ type regions and lightly doped N type regions in diode array cell regions by lithography, ion implantation and annealing so as to form diode array cells; isolate word lines from each other by deep trench isolation structures and isolate diode array cells on the same word line by shallow trench isolation structures, as shown in FIG. 1E. Form the connect of word lines by ion implantation into the word line pickup regions on both ends of word line so as to reduce the series resistance of word lines, as shown in FIG. 1F.

(7) finally, pick up bit lines by first metal layer and pick up word lines by second metal layer. The cross-sectional schematic view along the direction of bit lines in diode arrays is shown in FIG. 2A, and the cross-sectional schematic view along the direction of word lines is shown in FIG. 1H.

Figure 4C:
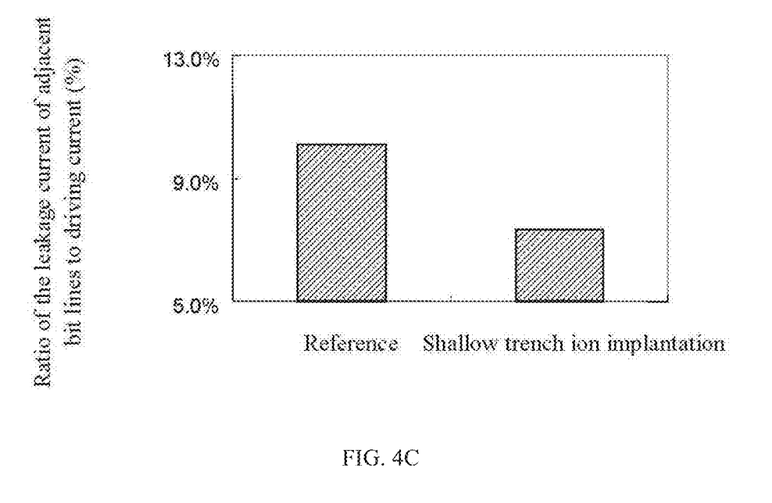
FIG. 4C is the ratio of the leakage current of adjacent bit lines to driving current in embodiment 2.

This embodiment adopts a method of dual shallow trench isolation to form epitaxial diode array, wherein deep trenches serve as the isolations between word lines and shallow trenches serve as the isolations between bit lines. After the formation of shallow trenches, the N type ion concentration at the shallow trench bottom is increased by ion implantation to effectively increase the coupling probability of minority carriers at the shallow trench bottom and prevent parasitic bipolar effect between adjacent bit lines, thereby reducing the leakage current between bit lines. As shown in FIG. 4C, the leakage current between bit lines is significantly prevented by implanting arsenic into the shallow trench bottom. This method is significantly important for the application of diode-driven, high-density, large-capacity phase change random access memory at 45 nm technology node and below.

Embodiment 3

By the optimization of the fabrication method, this embodiment provides a method of preventing the crosstalk current between word lines of the dual shallow trench isolated diode array:

(1) firstly, form heavily-doped first conductivity type (P+ type) regions and heavily-doped second conductivity type (N++ type) regions by ion implantation in the regions where diode arrays are situated on substrate of the first conductivity type (P type) (FIG. 1A). The heavily-doped second conductivity type (N++ type) regions serve as low resistance word line buried layer. After rapid thermal annealing under vacuum conditions, the width of word lines is greater than 0.2 microns and typical widths are 0.4 microns, 0.5 microns, 0.6 microns, 0.7 microns and etc.

(2) deposit an intrinsic epitaxial layer on the buried layer by chemical vapor epitaxy, wherein a typical thickness is in the range of 0.2 microns to 0.8 microns, as shown in FIG. 1B.

(3) form deep trenches of a depth in the range of 0.4 microns to 10 microns by lithography and etch (where the depth and spacing of trenches vary with technology node); then form a liner oxide layer by thermal oxidation.

Figure 3A:
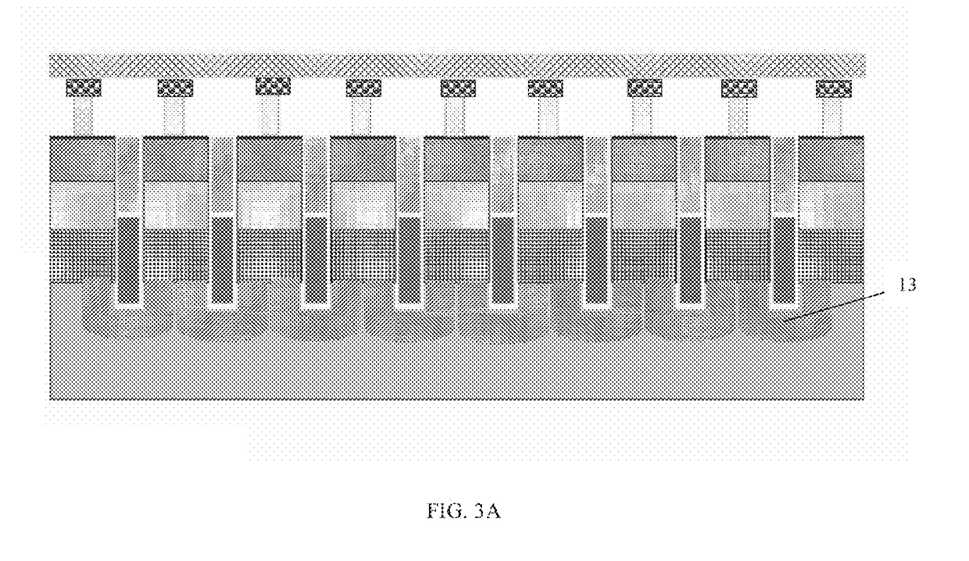
FIG. 3A is a schematic view of the method of preventing crosstalk current between adjacent word lines of dual shallow trench isolated diode array in embodiment 3.

(4) after the formation of liner oxide layer in deep trenches, dopant atoms of the same type as the substrate are implanted into the deep trench bottom by ion implantation and then are diffused at the deep trench bottom by thermal treatment to form electrical isolation 13 between word lines; as shown in FIG. 3A.

(5) fill polysilicon into deep trenches as insulating isolation layer; remove the polysilicon on the top of deep trenches by etching back polysilicon before oxide is filled in, as shown in FIG. 1C, so as to reduce the probability of word line leakage current caused by subsequent ion implantation.

(6) after planarization process, form shallow trench isolations vertical to deep trenches by lithography, etch, thermal oxidization, chemical vapor deposition and etc., that are compatible with conventional CMOS process, wherein the shallow trenches have a depth in the range of 0.1 microns to 2 microns, and typical depths are 0.28 microns, 0.4 microns and etc. The shallow trenches have a depth greater than or equal to the thickness of the epitaxial layer; as shown in FIG. 1D.

(7) after the shallow trench filling and planarization processes, divide the epitaxial layer into multiple isolation regions by deep trench isolation structures and shallow trench isolation structures, wherein isolation regions of both ends of the same word line serve as the pickup regions of the word line and the remaining isolation regions serve as diode array cell regions; form diode P+ type regions and lightly doped N type regions by lithography, ion implantation and annealing so as to form diode array cells and form the connect of both ends of word lines.

(8) finally, pick up bit lines by first metal layer and pick up word lines by second metal layer. The cross-sectional schematic view along the direction of bit lines in diode arrays is shown in FIG. 1G, and the cross-sectional schematic view along the direction of word lines is shown in FIG. 3A.

This embodiment adopts a method of implanting impurities of the same type (P+) as the substrate into the deep trench bottom by ion implantation to reduce the leakage current between word lines. The impurities at the deep trench bottom are diffused to the regions below word lines by thermal treatment so as to reduce the leakage current between adjacent word lines. The results shown in FIG. 5A indicate that, after boron implantation into the deep trench bottom and subsequent thermal treatment, the leakage current between adjacent word lines is effectively prevented. This method, simple in process and in no need of extra mask, is an ideal method of preventing the leakage current between word lines.

Other process conditions involved in the present invention are conventional process conditions within the field of those skilled in the art and as such will not be discussed herein. The aforementioned embodiments are only a description of the technical schemes of the present invention, but are not a limitation of the present invention. Any technical scheme within the spirit and scope of the present invention shall be included in the scope of the claims of the present invention.

What is claimed is:

1. A method of fabricating dual trench isolated epitaxial diode array, characterized by comprising the following steps:

(A) form heavily-doped first conductivity type regions on the substrate of the first conductivity type, and then form heavily-doped second conductivity type regions on said heavily-doped first conductivity type regions;

(B) form an epitaxial layer on heavily-doped second conductivity type regions;

(C) form first trenches deep to heavily-doped first conductivity type regions by lithography and etch so as to divide heavily-doped second conductivity type regions into multiple word lines; then form oxide layer on the inner surface of first trenches by thermal oxidization before polysilicon is filled into first trenches as insulating isolation layer; remove the polysilicon on the top of the first trenches by etching back before oxide is filled in, and then form the first trench isolation structures after planarization process;

(D) form second trenches vertical to the first trench isolation structures over word lines by lithography and etch; then form an oxide layer on the inner surface of second trenches before the insulation material is filled into second trenches by chemical vapor deposition, and form the second trench isolation structures after planarization process;

(E) divide the epitaxial layer into multiple isolation regions by the first and second trench isolation structures, wherein isolation regions of both ends of the same word line serve as the pickup regions of the word line and the remaining isolation regions serve as diode array cell regions; form diode P+ type regions and lightly doped N type regions in diode array cell regions by lithography, ion implantation and annealing so as to form diode array cells; isolate word lines from each other by first trench isolation structures and isolate diode array cells on the same word line by second trench isolation structures;

(F) form word line connect by ion implantation in the pickup regions of word lines so as to reduce series resistance of word lines; fabricating memory cells over diode array cells and pick up bit lines.

2. The method of fabricating said dual trench isolated epitaxial diode array according to claim 1, characterized in that, in step (A), the dopant atoms of said heavily-doped first conductivity type regions are boron and the dopant atoms of said heavily-doped second conductivity type regions are arsenic, phosphorus or antimony.

3. The method of fabricating said dual trench isolated epitaxial diode array according to claim 1, characterized in that the epitaxial layer grown in step (B) has a thickness in the range of 0.1 microns to 2 microns.

4. The method of fabricating said dual trench isolated epitaxial diode array according to claim 1, characterized in that first trenches formed in step (C) have a depth in the range of 0.4 microns to 10 microns.

5. The method of fabricating said dual trench isolated epitaxial diode array according to claim 1, characterized in that second trenches formed in step (D) have a depth in the range of 0.1 microns to 2 microns.

6. The method of fabricating said dual trench isolated epitaxial diode array according to claim 1, characterized in that said second trenches have a depth greater than or equal to the depth of the epitaxial layer.

7. The method of fabricating said dual trench isolated epitaxial diode array according to claim 1, characterized in that, during the formation of the second trench isolation structures in step (D), impurities of the second conductivity type are implanted into the bottom of second trenches by ion implantation after second trenches are etched and oxidized to form the oxide layer by thermal oxidization.

8. The method of fabricating said dual trench isolated epitaxial diode array according to claim 7, characterized in that said second trenches have a depth less than the depth of the epitaxial layer.

9. The method of fabricating said dual trench isolated epitaxial diode array according to claim 8, characterized in that said impurities of the second conductivity type are phosphorus and arsenic atoms.

10. The method of fabricating said dual trench isolated epitaxial diode array according to claim 8, characterized in that the implantation depth of said second conductivity type impurities is the difference between the epitaxial layer thickness and the second trench depth, and the concentration of the implanted impurities is equivalent to the concentration of said heavily-doped second conductivity type regions.

11. The method of fabricating said dual trench isolated epitaxial diode array according to claim 1, characterized in that, during the formation of the first trench isolation structures in step (C), impurities of the first conductivity type are implanted into the bottom of first trenches by ion implantation after the first trenches are etched and the oxide layer is formed, and then said impurities of the first conductivity type are activated to diffuse in the first trench bottom.

12. The method of fabricating said dual trench isolated epitaxial diode array according to claim 11, characterized in that said impurities of the first conductivity type are boron or boron fluoride.

13. The method of fabricating said dual trench isolated epitaxial diode array according to claim 1, characterized in that said memory cell is phase change random access memory cell, resistive memory cell, magnetoresistive memory cell or ferroelectric memory cell.

\* \* \* \* \*